US010930594B2

(12) United States Patent
Watanabe (10) Patent No.: US 10,930,594 B2
(45) Date of Patent: Feb. 23, 2021

(54) MULTILAYER WIRING SUBSTRATE, DISPLAY UNIT, AND ELECTRONIC APPARATUS

(71) Applicant: Sony Semiconductor Solutions Corporation, Kanagawa (JP)

(72) Inventor: Toshihiko Watanabe, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/531,186

(22) PCT Filed: Nov. 11, 2015

(86) PCT No.: PCT/JP2015/081717
§ 371 (c)(1),
(2) Date: May 26, 2017

(87) PCT Pub. No.: WO2016/088522
PCT Pub. Date: Jun. 9, 2016

(65) Prior Publication Data
US 2017/0345767 A1   Nov. 30, 2017

(30) Foreign Application Priority Data

Dec. 5, 2014   (JP) .............................. JP2014-247066

(51) Int. Cl.
*H01L 23/532* (2006.01)
*H01L 33/62* (2010.01)
(Continued)

(52) U.S. Cl.
CPC ...... *H01L 23/53295* (2013.01); *H01L 23/145* (2013.01); *H01L 23/49866* (2013.01);
(Continued)

(58) Field of Classification Search
CPC ............. H01L 23/528; H01L 23/53295; H01L 31/02002; H01L 33/62; H05K 3/46
(Continued)

(56) References Cited

U.S. PATENT DOCUMENTS

2004/0226745 A1* 11/2004 En ............................ C25D 3/38
174/262
2010/0301473 A1* 12/2010 Sasaoka .............. H01L 23/5389
257/737

FOREIGN PATENT DOCUMENTS

JP    2000-009657 A    1/2000
JP    2002-270898 A    9/2002
(Continued)

OTHER PUBLICATIONS

Written Opinion and English translation thereof dated Feb. 2, 2016 in connection with International Application No. PCT/JP2015/081717.
(Continued)

*Primary Examiner* — Mohammed Shamsuzzaman
(74) *Attorney, Agent, or Firm* — Wolf, Greenfield & Sacks, P.C.

(57) ABSTRACT

In a case of a multilayer wiring structure in which an insulating layer provided between wires is made of a material having high transmittance of light in a visible range containing ultraviolet rays, wires in the upper layer and those in a lower layer may be recognized together when defects of an upper layer are visually inspected. In this case, the lower layer may be noise for the inspection of the wires in the upper layer, lowering inspection accuracy. This lowered inspection accuracy has inhibited improvement in manufacturing yields and reliability. In order to solve this issue, a multilayer wiring substrate of the disclosure includes: a substrate; and a first wire and a second wire that are provided on the substrate with an insulating layer having
(Continued)

a light transmitting property in between, and one or both of which are subjected to a surface treatment.

15 Claims, 6 Drawing Sheets

(51) Int. Cl.
  *H01L 23/14* (2006.01)
  *H01L 23/498* (2006.01)
  *H05K 3/46* (2006.01)
  *H01L 23/528* (2006.01)
  *H01L 31/02* (2006.01)
  *H05K 1/02* (2006.01)
  *H05K 1/09* (2006.01)

(52) U.S. Cl.
  CPC ...... *H01L 23/528* (2013.01); *H01L 31/02002* (2013.01); *H01L 33/62* (2013.01); *H05K 3/46* (2013.01); *H05K 3/4676* (2013.01); *H05K 1/0274* (2013.01); *H05K 1/09* (2013.01); *H05K 2201/0108* (2013.01)

(58) Field of Classification Search
  USPC .................................. 257/80, 737; 174/262
  See application file for complete search history.

(56) References Cited

FOREIGN PATENT DOCUMENTS

| | | |
|---|---|---|
| JP | 2003-115613 A | 4/2003 |
| JP | 2006-091753 A | 4/2006 |
| JP | 2008-172151 A | 7/2008 |

OTHER PUBLICATIONS

International Preliminary Report on Patentability and English translation thereof dated Jun. 15, 2017 in connection with International Application No. PCT/JP2015/081717.

* cited by examiner

MULTILAYER WIRING SUBSTRATE, DISPLAY UNIT, AND ELECTRONIC APPARATUS

This Application is a national stage filing under 35 U.S.C. 371 of International Patent Application Serial No. PCT/JP2015/081717, filed Nov. 11, 2015, entitled "MULTILAYER WIRING SUBSTRATE, DISPLAY UNIT, AND ELECTRONIC APPARATUS," which claims priority under 35 U.S.C. § 365(b) or 35 U.S.C. § 119(a)-(d) to Japanese application number 2014-247066, filed Dec. 5, 2014, the entire contents of which are incorporated herein by reference in their entireties.

TECHNICAL FIELD

The technology relates to: a multilayer wiring substrate in which a plurality of wires are stacked with an insulating layer having a light transmitting property in between; a display unit provided with the multilayer wiring substrate; and an electronic apparatus.

BACKGROUND ART

High-luminance display units cause their peripheral members to be directly or indirectly exposed to light having high intensity. Therefore, there is a demand for insulating layers formed, for example, immediately above or below a light emitting device to have resistance to light in the ultraviolet range. As an example, a material with a high transmittance of light in the visible range containing ultraviolet rays is used, as described in PTL 1 and PTL 2.

Electronic devices have the increasing number of wires and complicated circuits in order to improve their performances. In particular, display units and other devices have more-highly complicated circuits, for example, that contain many thin film transistors (TFTs) and wire circuits and large areas of capacitative elements. In addition to this, an increase in definition has led to the increasing number of pixels, thereby driving the trend toward provision of wire layers at high density in which driving wires, signal lines, etc. are formed. In this case, an occurrence of short circuits is increased and manufacturing yields are decreased. To address this issue, a so-called multilayered wiring structure in which wiring layers in which driving wires, signal lines, etc. are formed are stacked with an insulating layer therebetween is employed.

CITATION LIST

Patent Literature

[PTL 1] Japanese Unexamined Patent Application Publication No. 2002-270898
[PTL 2] Japanese Unexamined Patent Application Publication No. 2003-115613

SUMMARY OF INVENTION

However, for an insulating layer provided between wires in the above multilayered wiring structure, a material having high transmittance of light in the visible range containing ultraviolet rays may be used as described above. The material having high transmittance of light in the visible light may be, for example, a transparent insulating material. When defects of an upper layer are visually inspected in this case, wires in the upper layer and those in a lower layer may be recognized together. In this case, the lower layer may be noise for the inspection of the wires in the upper layer, lowering inspection accuracy. This lowered inspection accuracy has inhibited improvement in manufacturing yields and reliability.

It is desirable to provide a multilayer wiring substrate, a display unit, and an electronic apparatus which make it possible to improve their manufacturing yields and reliability.

A multilayer wiring substrate according to an embodiment of the technology includes: a substrate; and a first wire and a second wire that are provided on the substrate with an insulating layer having a light transmitting property in between, and one or both of which are subjected to a surface treatment.

A display unit according to an embodiment of the technology includes a light emitting device in the above-described multilayer wiring substrate of the technology.

An electronic apparatus according to an embodiment of the technology includes an electronic device in the above-described multilayer wiring substrate of the technology.

In each of the multilayer wiring substrate, the display unit, and the electronic apparatus according to the embodiments of the technology, one or both of the first wire and the second wire disposed with the insulating layer having the light transmitting property therebetween are subjected to the surface treatment. This increases an optical signal-to-noise ratio, improving inspection accuracy.

In each of the above multilayer wiring substrate, display unit, and electronic apparatus according to the embodiments of the technology, one or both of the first wire and the second wire disposed with the insulating layer having the light transmitting property therebetween are subjected to the surface treatment. This increases an optical signal-to-noise ratio, improving inspection accuracy. Consequently, it is possible to provide a display unit and an electronic apparatus each of which includes a highly reliable multilayer wiring substrate that improves manufacturing yields. It is to be noted that the effects described above are not limiting and any of the effects described in the disclosure may be provided.

DESCRIPTION OF EMBODIMENTS

Some embodiments of the disclosure will be described below in detail with reference to the accompanying drawings. The description is given in the following order.

1. Embodiment (An example in which, of multilayer wires, a lower-layer wire has been subjected to a surface treatment)
    1-1. Basic configuration
    1-2. Configuration of display unit
    1-3. Function and effect
2. Exemplary application (An exemplary electronic apparatus including an electronic device)

1. Embodiment 1-1. Basic Configuration

Figure 1:
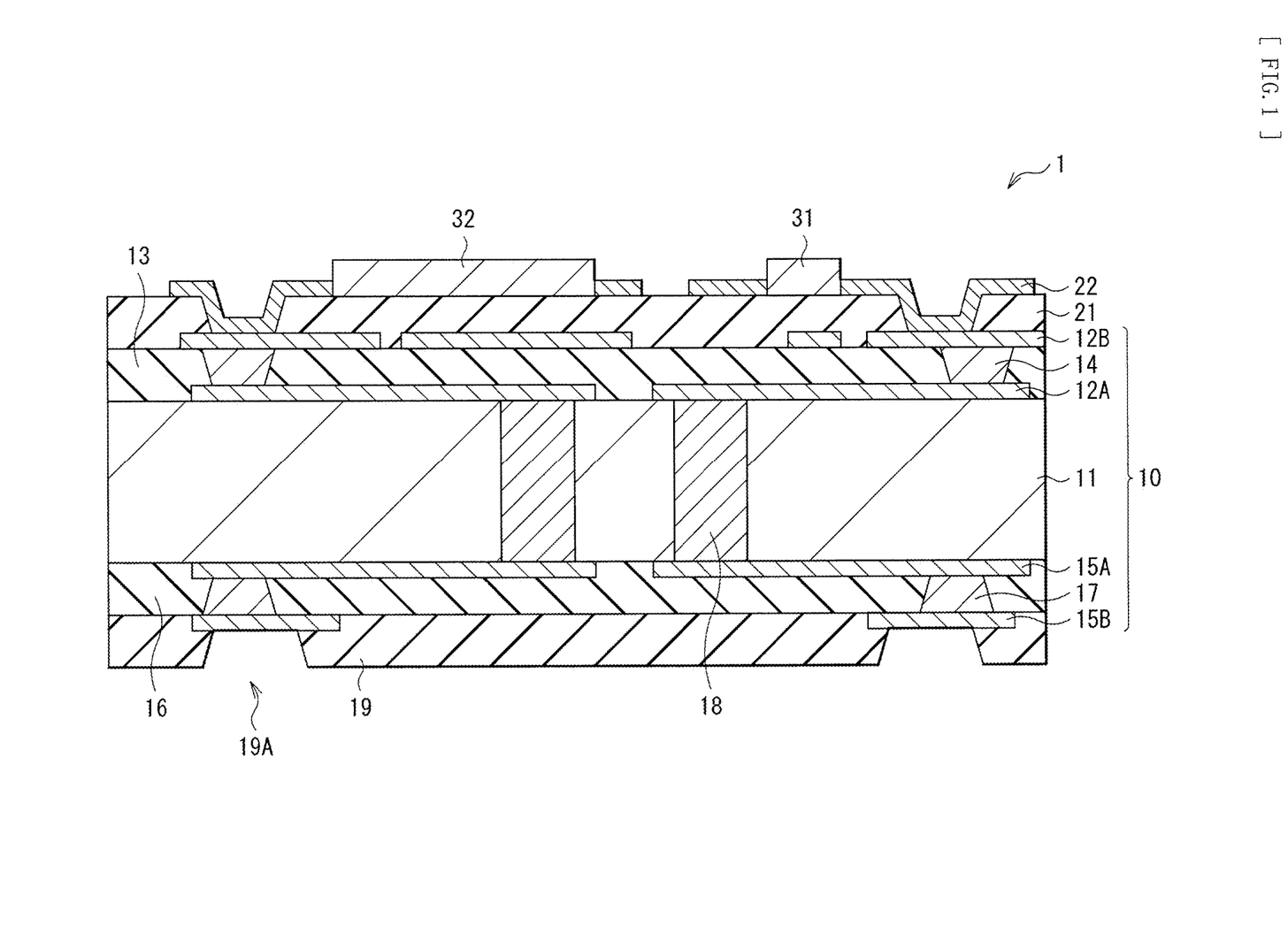
FIG. 1 is a cross-sectional view of a multilayer wiring substrate according to an embodiment of the disclosure.

FIG. 1 illustrates a cross-sectional configuration of a multilayer wiring substrate, which is referred to as a multilayer wiring substrate 1, according to an embodiment of the disclosure in a perspective view. The multilayer wiring substrate 1 is used as a substrate for a display panel in a display unit, such as a tiling display illustrated in FIG. 4. The multilayer wiring substrate 1 includes a substrate 10 in which a plurality of wires, including wires 12A, 12B, 15A, and 15B, are disposed on the front and rear surfaces of a base material 11. In addition, provided on the substrate 10 are a wire 22 and an electronic device, such as a light emitting device 31, with an insulating layer 21 having a light transmitting property in between. In this embodiment, the wire 12B formed in the front surface of the substrate 10 has been subjected to a surface treatment, and thus its reflection factor in the visible range differs from that of the wire 22 formed on the insulating layer 21. Herein, the wire 12B corresponds to a first wire, and the wire 22 corresponds to a second wire.

As illustrated in FIG. 1, for example, the substrate 10 includes the base material 11 and the wires 12A, 12B, 15A, and 15B. The wires 12A and 12B are stacked on the front surface of the base material 11 with an insulating layer 13 in between. The wires 15A and 15B are stacked on the rear surface of the base material 11 with an insulating layer 16 in between. The wires 12A and 12B are electrically coupled to each other through a bump 14 formed across the insulating layer 13. The wires 15A and 15B are electrically coupled to each other through a bump 17 formed across the insulating layer 16. The wires 12A and 15A are electrically coupled to each other through a through via 18 formed across the base material 11. Further, an insulating layer 19 is provided, as a protective film, on the wire 15B on the rear surface of the base material 11. Provided in the insulating layer 19 at any location is an aperture 19A, for example, which allows the wire 15B to be coupled to an unillustrated external circuit.

Examples of the base material 11 may include a plastic substrate, a metallic foil substrate, and a paper sheet as well as a glass substrate. Examples of the plastic substrate may include polyethersulfone, polycarbonate, polyimides, polyamides, polyacetals, polyethylene terephthalate, polyethylene naphthalate, polyethyl ether ketone, and polyolefins. The metallic foil substrate has surfaces subjected to an insulating treatment, and its examples may include aluminum (Al), nickel (Ni), copper (Cu), and stainless steel. Alternatively, the base material 11 may include an insulating resin layer, such as polyimide and an epoxy-based resin, provided on the front surface of a metal base substrate, such as Al, and a wire pattern made of the above-described reflective material printed on the insulating resin layer. Alternatively, the base material 11 may be a film base material made of a glass-containing resin, such as FR4 (glass epoxy resin) or CEM3 (glass composite resin).

The wires 12A, 12B, 15A, and 15B are provided within selective regions over the base material 11. Each of the wires 12A, 12B, 15A, and 15B may be made of, for example, single-element metal, such as copper (Cu), platinum (Pt), titanium (Ti), ruthenium (Ru), molybdenum (Mo), Cu, tungsten (W), Ni, Al, and tantalum (Ta), or an alloy thereof. Preferably, Cu may be used because Cu has a low resistivity and enables a reduction in a delay time of a wire and a high speed. Alternatively, two or more types of the above-described metal may be used stacked on each other. Each of the bumps 14 and 17 and the through vias 18 may be made of a material that is similar to that for the wires 12A, 12B, 15A, and 15B.

In this embodiment, one of two types of wires stacked on each other with an insulating layer having a light transmitting property in between has been subjected to a surface treatment. More specifically, of the wire 12B and the wire 22 provided on the wire 12B with the insulating layer 21 in between, the wire 12B provided in a lower layer of the insulating layer 21 has been subjected to the surface treatment. The surface treatment may be performed such that the reflection factors of the wire 12B and the wire 22 in the visible region differ from each other. More concretely, the surface treatment may be an etching process for roughing the surface of the wire 12B or a blackening process, especially in the case of using Cu. It is to be noted that, herein, examples of the blackening process may include a blackening process for generating a so-called copper oxide and a roughening blackening process that is alternative to blackening, which is referred to as a blackening alternate roughing process. Further, although the surface treatment may be applied to either one of an upper-layer wire and a lower-layer wire, the surface treatment may be preferably applied to the lower-layer wire in terms of adhesion to an insulating layer that will be described later and ease of a visual inspection for detecting a short-circuit defect.

Figure 2A:
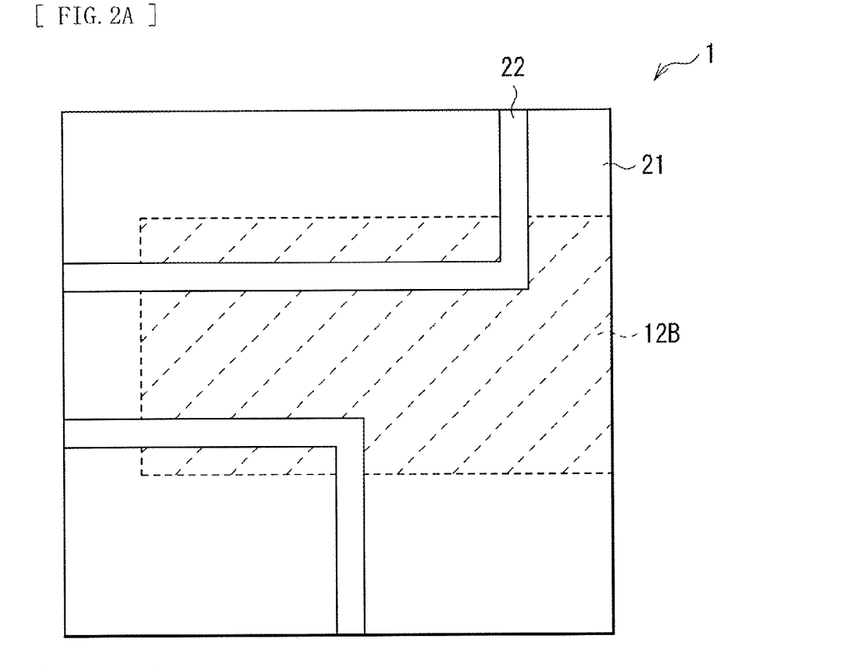
FIG. 2A is a schematic plan view of the multilayer wiring substrate illustrated in FIG. 1.
Figure 2B:
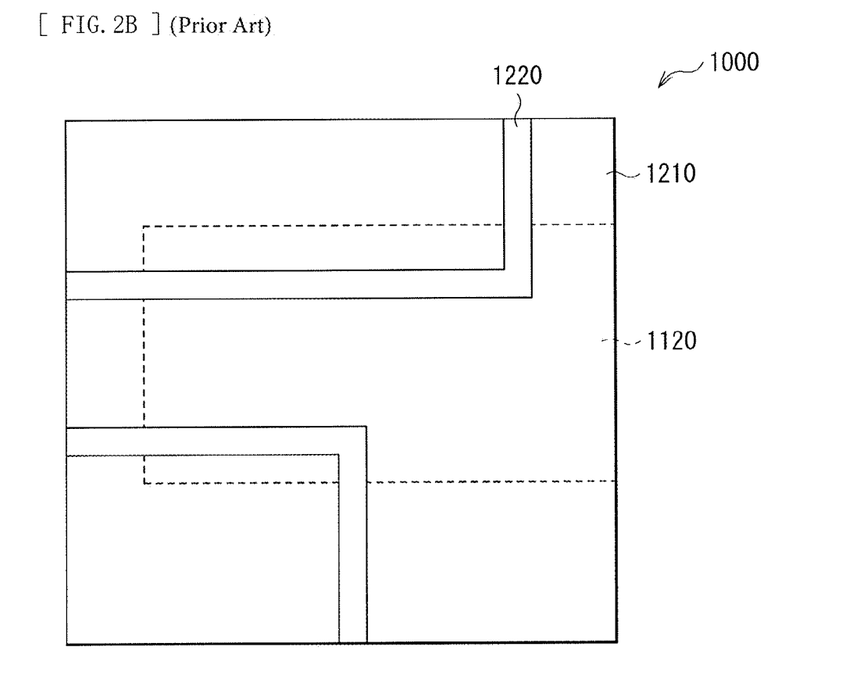
FIG. 2B is a schematic plan view of a multilayer wiring substrate in a comparative example.

FIG. 2A schematically illustrates a planar configuration of a portion of the stack structure of the wire layers 12B and 22 and the insulating layer 21 in the multilayer wiring substrate 1 illustrated in FIG. 1. FIG. 2B schematically illustrates a planar configuration of wires 1120 and 1220 stacked with an insulating layer 1210 having a light transmitting property in between, which is similar to that of the multilayer wiring substrate 1. Compared to the multilayer wiring substrate 1000 in which a lower-layer wire (wire 1120) has not been subjected to a blackening process, the multilayer wiring substrate 1 according to this embodiment exhibits a higher contrast between an upper-layer wire (wire 22) and a lower-layer wire (wire 12B). Thus, the multilayer wiring substrate 1 improves inspection accuracy of a visual inspection for detecting a short-circuit defect.

In addition, one of the wires 12B and 22 may be subjected to a plating process so that the colors of the wires 12B and 22 differ from each other. More specifically, when the wires 12B and 22 are formed using Cu, for example, the wire 12B may be subjected to electroless plating using Ni, tin (Sn), zinc (Zn), silver (Ag), or gold (Au), for example. Performing the electroless plating in this manner can improve inspection accuracy of a short-circuit defect inspection, such as an optical inspection, as in the case of performing an etching process or a blackening process. Furthermore, plated metal used to coat the wire 12B may be metal, such as Ni, having a lower capacity to liberate ions than metal, such as Cu, of the wire 12B under an application of an electric field. Using this metal can improve resistance to ion migration.

Figure 3:
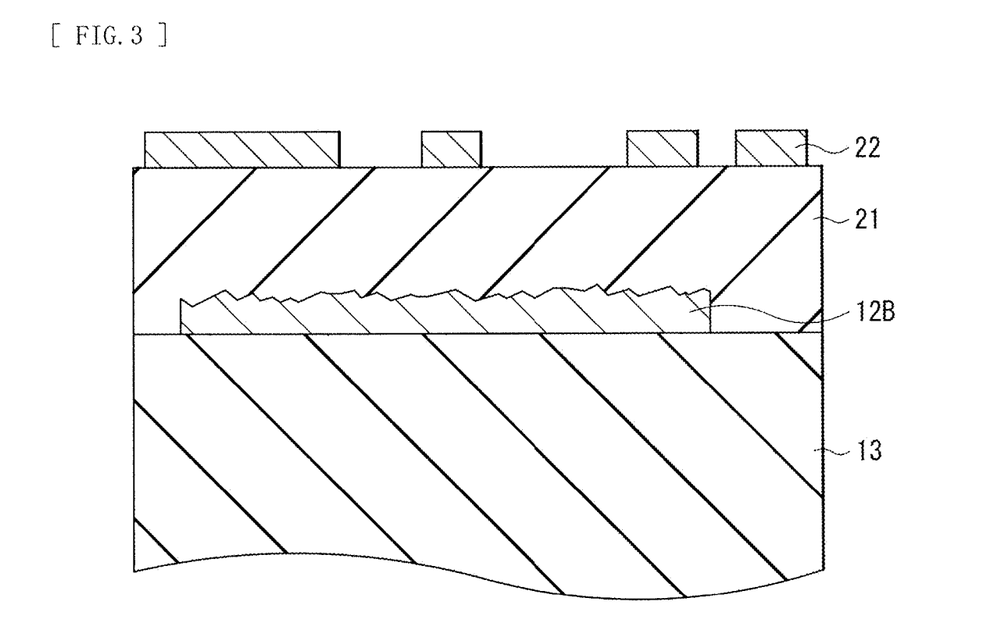
FIG. 3 is a schematic cross-sectional view of the multilayer wiring substrate illustrated in FIG. 1.

It is to be noted that, as for the disposing pitches of the wire layer 12B and the wire 22 stacked with the insulating layer 21 having a light transmitting property in between, a lower-layer wire (wire 12B) may preferably have a larger pitch, as illustrated in FIG. 3. This is because roughing the surface of the wire 12B can improve the adhesion between the wire 12B and the insulating layer 21 because of an anchor effect. Further, a short-circuit defect inspection of the lower-layer wire (wire 12B) is more difficult to check than that of the upper-layer wire (wire 22). Likewise, a short circuit in the lower-layer wire (wire 12B) is more difficult to cut and repair than that in the upper-layer wire (wire 22). Therefore, by increasing the pitch of the wire 12B, namely, relaxing a design rule therefor, occurrence of a short circuit in the wire 12B can be reduced. Further, in some cases, a visual inspection of the lower-layer wire may be unnecessary. As for the pitch widths of the wires 12B and 22, it is preferable that the pitch width of the wire 22 be set to less than 150 μm, for example, and the pitch width of the wire 12B be set to 150 μm or more, for example.

Each of the insulating layers 13, 16, and 19 may be made of a material containing one or more of, for example, a silicon oxide (SiO), a silicon nitride (SiN), a silicon oxynitride (SiON), a hafnium oxide (HfO), an aluminum oxide (AlO), an aluminum nitride (AlN), a tantalum oxide (TaO), a zirconium oxide (ZrO), a hafnium oxynitride, a hafnium silicon oxynitride, an aluminum oxynitride, a tantalum oxynitride, and a zirconium oxynitride. Each of the insulating layers 13, 16, and 19 may have a single layer structure or a multilayer structure using two or more materials, including a SiN film and a SiO film, for example. Each of the insulating layers 13, 16, and 19 may be patterned in a predetermined shape by etching after having been applied and formed. Alternatively, depending on their material, the insulating layers 13, 16, and 19 may be patterned and formed by a print technique, such as ink jet printing, screen printing, offset printing, and gravure printing.

Formed on the substrate 10 are the wire 22, the light emitting device 31, and a driver IC (integrated circuit) 32 with the insulating layer 21 having a light transmitting property in between.

The insulating layer 21 is used to prevent the wire 15B and the wire 22 from being short-circuited. A material for the insulating layer 21 may be preferably a material having resistance to light in order to suppress degradation of the insulating layer 21 by exposure to light emitted from the light emitting device 31, which will be described later. More specifically, the material may be, for example, an organic insulating material such as a silicone-based material, a polyimide-based material, a polyacrylate-based material, an epoxy-based material, a cresol-novolac-based material, a polystyrene-based material, a polyamide-based material, and a fluorine-based material. It is to be noted that a material used for the insulating layer 21 is not limited to the organic insulating material and may be, for example, the inorganic insulating material that has been exemplified as a material for the above-described insulating layers 13, 16, and 19.

A material for the wire 22 may be the material that has been exemplified as a material for the above-described wires 12A, 12B, 15A, and 15B. For the wire 22, either the material the same as that for the wires 12A, 12B, 15A, and 15B or a different material may be used. Using Cu in particular may be preferable. It is to be noted that the wires 12A, 12B, 15A, 15B, and 22 may be formed by one of plating, various types of evaporation methods, and sputtering, for example.

The light emitting device 31 may be, for example, an LED (light emitting diode) that emits light by recoupling electrons, which serve as carriers, to holes when an electric current is injected into the contact surface between the p-type and n-type semiconductors in the forward direction. Although there is no specific limitation on a material for the light emitting device 31, examples of this material may include a gallium-based compound semiconductor such as gallium nitride (GaN) that emits blue light, gallium phosphide (GaP) that emits green light, gallium arsenide phosphide (GaAsP) that emits red light, and aluminum gallium arsenide (AlGaAs).

The driver IC 32 may be, for example a semiconductor device in which a circuit is provided on the surface of a semiconductor substrate (Si substrate) with a semiconductor circuit forming technique.

Each of the light emitting device 31 and the driver IC 32 may be a single element, or may be made into a chip component by being contained in a package or being molded with a resin, for example.

It is to be noted that, by combining light emitting devices 31 (31R, 31G, and 31B, all not illustrated) that emit a red color (R), a green color (G), and a blue color (B) by using the above-described materials that emit red light, green light, and blue light to form pixels, it is possible to achieve a high-luminance display unit, or a display unit 2. A configuration of the display unit 2 will be described below.

1-2. Configuration of Display Unit

Figure 4:
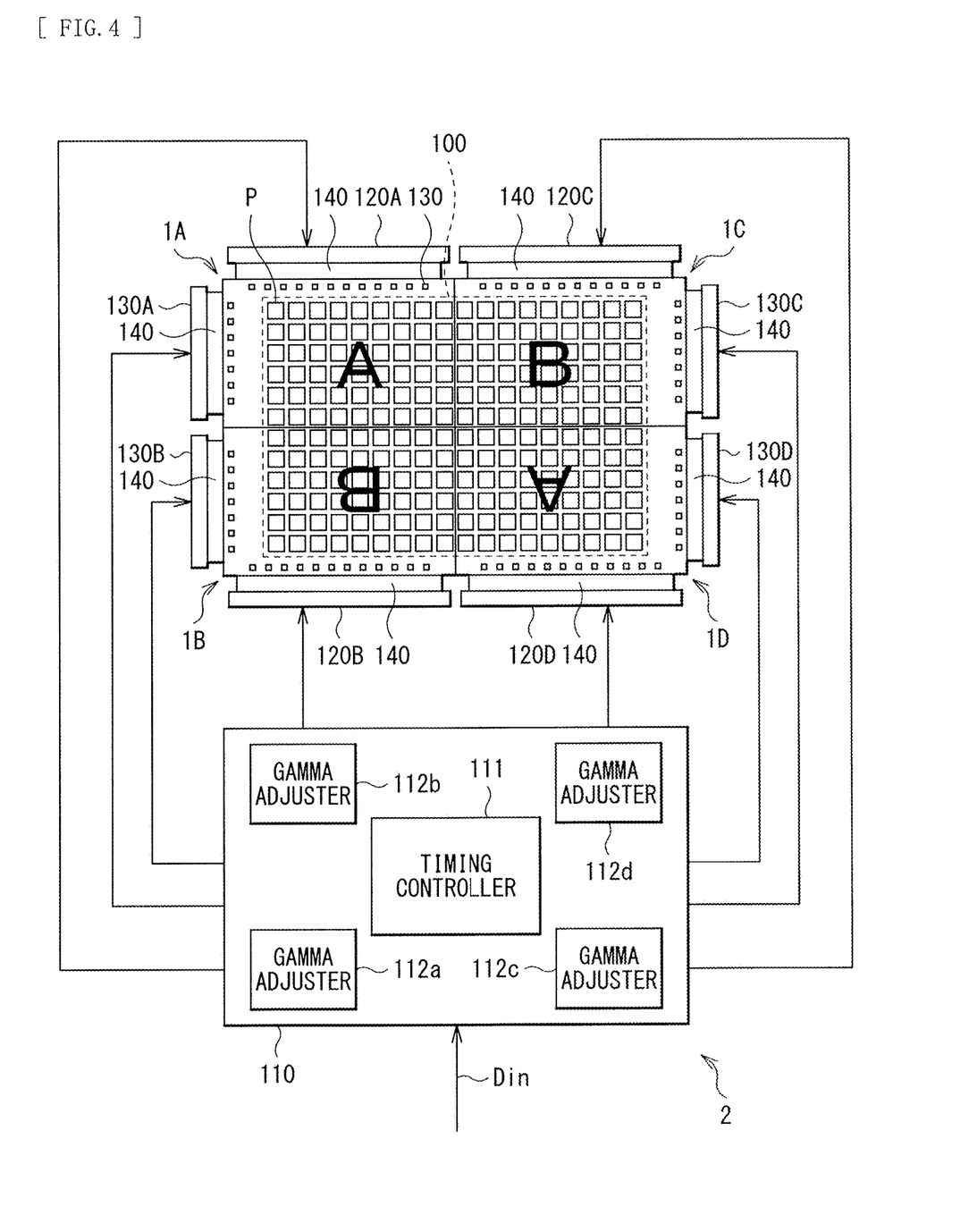
FIG. 4 is a diagram illustrating an overall configuration of a display unit that uses the multilayer wiring substrate illustrated in FIG. 1.

FIG. 4 illustrates an overall configuration of the display unit 2 that uses the multilayer wiring substrate 1 of the disclosure. The display unit 2 is a so-called tiling display and includes a plurality of display panels, more specifically, four display panels 1A, 1B, 1C, and 1D in this case. The above-described multilayer wiring substrate 1 is used for each of the display panels 1A to 1D, in which, for example, an unillustrated opposing substrate is bonded to a multilayer wiring layer 1 with an unillustrated adhesion layer in between. The display panels 1A to 1D are disposed within a 2×2 region in a two-dimensional fashion, for example. The display regions in the display panels 1A to 1D can be combined to display an image. It is to be noted that, in FIG. 4, the marks "A" and "B" and their orientations schematically depict the type and layout state of backplanes used. The type and layout of the backplanes used for the display panels 1A to 1D will be described later.

In the display unit 1, the display panels 1A to 1D are coupled to respective driver ICs 32 for display driving, for example. More specifically, for example, a signal line drive circuit 120A and a scan line drive circuit 130A are mounted in the display panel 1A by means of a COF (chip on film) 140, for example. It is to be noted that these driver ICs may be directly formed, or contained, in the display panel 1A or may be mounted thereon with another technique, such as by means of COG (chip on glass), as illustrated in FIG. 1. Further, when the light emitting device 31 described above are used as a display device, the display panel 1A is further coupled to an unillustrated power line drive circuit. Similarly to the display panel 1A, for example, the display panel 1B is coupled to a signal line drive circuit 120B and a scan line drive circuit 130B via a COF 140. Likewise, for example, the display panel 1C is coupled to a signal line drive circuit 120C and a scan line drive circuit 130C via a COF 140, and the display panel 1D is coupled to a signal line drive circuit 120D and a scan line drive circuit 130D via a COF 140.

All of the signal line drive circuits 120A to 120D and the scan line drive circuits 130A to 130D are coupled to a drive controller 110. The drive controller 110 can control display driving of the display panels 1A to 1D independently of one another, on the basis of an image signal Din to be received from the outside. The drive controller 110 includes a timing controller 111 and gamma adjusters 112a to 112d, for example.

Each of the display panels 1A to 1D includes a plurality of pixels P arranged in a matrix fashion. The display panels 1A to 1D cause the signal line drive circuits 120A to 120D and the scan line drive circuits 130A to 130D to perform display driving, thereby driving the pixels P in an active-matrix manner. In this way, the display panels 1A to 1D display an image on the basis of the image signal Din to be received from the outside. It is to be noted that, in the individual drawings, for example, the numbers, pitches, and sizes of the pixels P and terminals 130, which will be described later, are depicted in a simplified manner for the sake of explanation, and differ from actual ones accordingly.

Each of the display panels 1A to 1D has a rectangular or square surface, for example. In this case, the surface is rectangular. The display panels 1A to 1D are arranged adjacent to one another in a two-by-two matrix as a whole. More specifically, the display panels 1A to 1D are deployed on an unillustrated housing or substrate, for example. The region formed by combining the display regions of the display panels 1A to 1D corresponds to the display region, or a display region 100, of the display unit 1. It is to be noted that, hereinafter, when it is not necessary to distinguish the display panels 1A to 1D from one another, the display panel 1A will be described as a representative example.

Figure 5A:
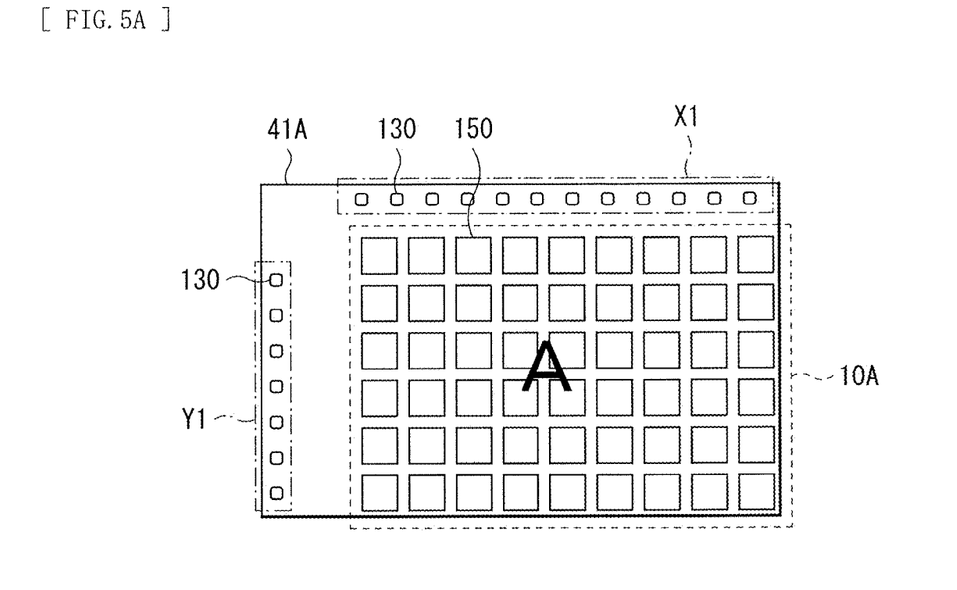
FIG. 5A is a schematic plan view for explaining a configuration of a backplane.
Figure 5B:
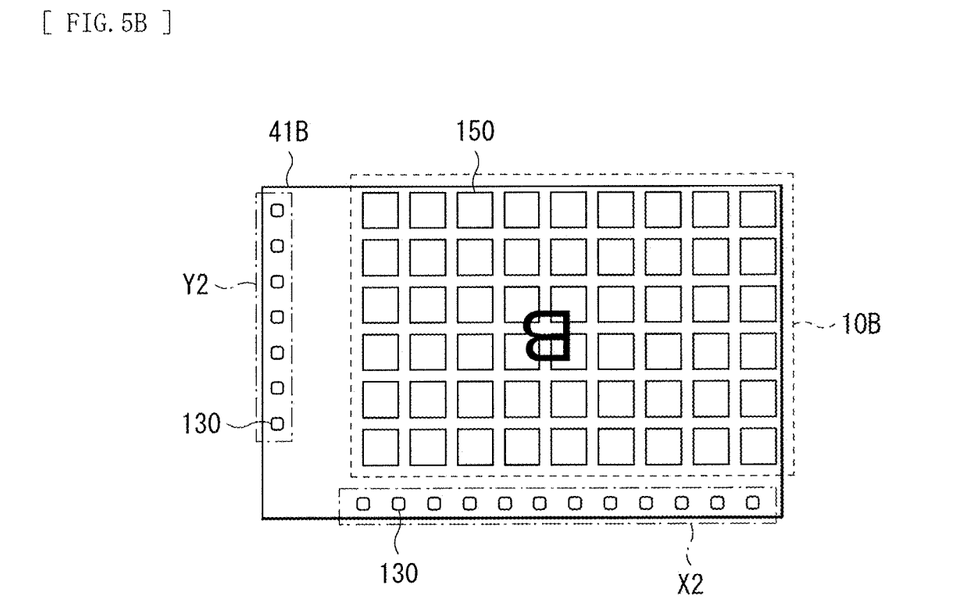
FIG. 5B is a schematic plan view for explaining a configuration of a backplane.

FIG. 5A illustrates a configuration of a backplane 41A, and FIG. 5B illustrates a configuration of a backplane 41B. As illustrated in FIG. 5A, the backplane 41A includes pixel circuits 150 within a region corresponding to a portion of the display region 100. These pixel circuits 150 are provided for the respective pixels P, and this region is referred to as a region 10A. In other words, the plurality of pixel circuits 150 are arranged in the backplane 41A in a two-dimensional fashion. In addition, terminals 130 for mounting are disposed within rectangular regions X1 and Y1 along two sides of a peripheral region of a region, or the region 10A, in which the pixel circuits 150 are formed. More specifically, the plurality of terminals 130 are arranged along the left and upper sides out of the four sides positioned on the upper, lower, right, and left of the rectangle. The terminals 130 are pads to be coupled to the signal line drive circuits 120A to 120D, the scan line drive circuits 130A to 130D, or any other circuit described above, by wires. In contrast, as illustrated in FIG. 5B, the backplane 41B includes pixel circuits 150 within a region corresponding to a portion of the display region 100. These pixel circuits 150 are provided for the respective pixels P, and this region is referred to as a region 10B. Specifically, the plurality of pixel circuits 150 are arranged in the backplane 41B in a two-dimensional fashion. Terminals 130 for mounting are disposed within rectangular regions X2 and Y2 along two sides of a peripheral region of a region, or the region 10B, in which the pixel circuits 150 are formed. More specifically, the plurality of terminals 130 are arranged along the left and lower sides out of the four sides positioned on the upper, lower, right, and left of the rectangle. As described above, the layout, such as locations, of the terminals 130 in the backplane 41A differs from that in the backplane 11B.

Of the backplanes 41A and 11B, for example, the backplanes 41A are disposed in the display panels 1A and 1D, and backplanes 41B are disposed in the display panels 1B and 1C. In other words, the backplanes 41A are used for the pair of display panels 1A and 1D as the same type of backplanes, and the backplanes 41B are used for the pair of display panels 1B and 1C as the same type of backplanes. It is to be noted that the "types" of backplanes are distinguished from one another, for example, by the layouts of the pixel circuit 150 and the terminal 130 therein. To give an example, the "same type" means that the layouts of the pixel circuits 150 and the terminals 130 are substantially the same as each other. In other words, for example, it is sufficient that the locations, shapes, and numbers of the pixel circuits 150 and the terminals 130 are substantially the same as each other; however, some design errors or local layout changes may be acceptable.

As illustrated in FIG. 4, the timing controller 111 in the drive controller 110 controls the signal line drive circuits 120A to 120D and the scan line drive circuits 130A to 130D, for example in such a way that the circuits therein operate in relation to one another. As an example, the timing controller 111 may output control signals to the above circuits in accordance with the image signal Din to be received from the outside.

The gamma adjusters 112a to 112d are provided so as to individually correspond to the display panels 1A to 1D. For example, the gamma adjusters 112a to 112d make a gamma adjustment, namely, gamma compensation to the image signal Din in a digital format which has been received from the outside and then outputs resultant image signals to the signal line drive circuits 120A to 120D. More specifically, the gamma adjuster 112a makes a gamma adjustment for the display panel 1A; the gamma adjuster 112b makes a gamma adjustment for the display panel 1B; the gamma adjuster 112c makes a gamma adjustment for the display panel 1C; and the gamma adjuster 112d makes a gamma adjustment for the display panel 1D. It is to be noted that the drive controller 110 may perform other signal processes, such as an overdrive correction, in addition to the gamma correction.

The signal line drive circuits 120A to 120D apply signal voltages in an analog format related to the image signals received from the gamma adjusters 112a to 112d to respective signal lines DTL, for example, in accordance with control signals from the timing controller 111.

Each of the scan line drive circuits 130A to 130D sequentially selects a plurality of scan lines WSL in predetermined units, for example, in accordance with the control signal from the timing controller 111. Each of the scan line drive circuits 130A to 130D executes a Vth correction, writing of a signal voltage, a µ correction, etc. in a desired order, for example, by selecting one or more scan lines WSL in a predetermined sequence. Here, the Vth correction refers to a correction operation in which a voltage Vgs between the gate and source of a drive transistor Tr1 is approximated to the threshold voltage of the drive transistor. The writing of the signal voltage refers to a wiring operation in which a signal voltage is written into the gate of the drive transistor Tr1 via a write transistor Tr2. The µ correction refers to a correction operation in which the voltage Vgs retained between the gate and source of the drive transistor Tr1 is corrected in accordance with the magnitude of the mobility µ of the drive transistor Tr1.

1-3. Working and Effect

As mentioned above, electronic devices have the increasing number of wires and complicated circuits in order to improve their performances. For example, when a plurality of wires are stacked on each other with an insulating layer in between, as with the wire 22 in the multilayer wiring substrate 1 illustrated in FIG. 1 and a plurality of wires are provided in a single layer at a high density, the wires are prone to being short-circuited due to a failure of a film forming process. This short-circuit may result in an electrical short-circuit of the wires, becoming the cause of a circuit abnormality. Therefore, it is necessary to check whether a short-circuit part is present through a visual inspection for detecting short-circuit defects and thereby cut, repair, or remove the detected short-circuit part.

However, in the high-luminance display unit 2 that uses an LED, for example, as its light emitting device as illustrated in FIG. 4, an insulating layer, such as the insulating layer 21 illustrated in FIG. 1, formed immediately below the light emitting device is made of an insulating material having a light transmitting property. This is because peripheral members are directly or indirectly exposed to light with high intensity. Therefore, in this case, when a short-circuit defect inspection of the wire 22 formed on the insulating layer 21 is conducted, a wire, such as the wire 12B, provided under the insulating layer 21 may be noise, thereby lowering inspection accuracy. The lowering of the inspection accuracy may reduce a manufacturing yield and reliability.

In contrast to the above, in the multilayer wiring substrate 1 according to this embodiment, the wire 12B disposed under the insulating layer 21 having a light transmitting property has been subjected to a surface treatment so that the reflection factors of the wires 12B and 22 in the visible range, for example, differ from each other. This can increase an optical signal-to-noise ratio of the wire 12B to the wire 22, improving inspection accuracy of a short-circuit defect inspection (a visual inspection) such as an optical inspection.

As described above, in this embodiment, one of two types of wires stacked on each other with an insulating layer having a light transmitting property in between is subjected to a surface treatment. As one example, the wire 12B disposed under the insulating layer 21 may be subjected to a surface treatment. Applying a surface treatment in this manner can cause the reflection factors of the wire 12B and the wire 22, for example, in the visible range to differ from each other, thereby increasing an optical signal-to-noise ratio of the wire 12B to the wire 22. Consequently, it is possible to improve inspection accuracy of a visual inspection for detecting a short-circuit defect, thereby making it possible to improve a manufacturing yield of the multilayer wiring substrate 1 and to provide a high reliable display unit and electronic apparatus.

The surface of the wire 12B on underlayer side is subjected to a roughening process such as an etching process and a blackening process, as the surface treatment, in particular. As a result, the adhesion between the wire 12B and the insulating layer 21 is improved in addition to the improvement in the optical signal-to-noise ratio. This can reduce an occurrence of, for example, peeling off of a film. Consequently, it is possible to improve the reliability of the multilayer wiring substrate 1, the display unit provided with the multilayer wiring substrate 1, and the electronic apparatus.

Alternatively, the wire 12B on the underlayer side may be subjected to a plating process using metal, the color of which differs from that of the wire 22, so that a plating film is provided over the surface of the wire 12B. This also makes it possible to improve inspection accuracy of a visual inspection. In particular, by selecting metal having a lower capacity to liberate ions than a metal material for the wire 12B under an application of an electric field, it is possible to improve resistance to ion migration, thereby further improving the reliability.

2. Exemplary Application

The multilayer wiring substrate 1 and the display unit 2 provided with the multilayer wiring substrate 1 that have been described in the embodiment are applicable to display units in electronic apparatuses in various fields which display an image signal to be received from the outside or generated therein as a still image or a moving image. Examples of such electronic apparatuses include a television apparatus, a digital camera, a notebook personal computer, a portable terminal device such as a portable phone, and a video camera. An exemplary electronic apparatus will be described below.

Figure 6:
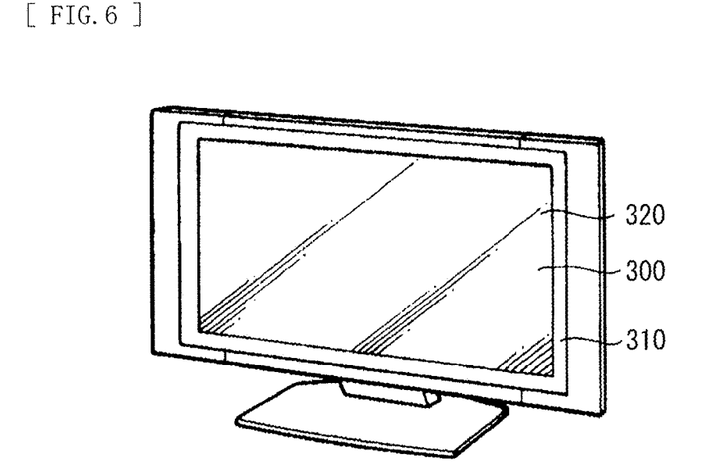
FIG. 6 is a perspective view of an appearance of exemplary application 1.

FIG. 6 illustrates an appearance of a television apparatus to which the above-described multilayer wiring substrate 1 according to the embodiment is applied. This television apparatus includes an image display screen 200 having a front panel 210 and a filter glass 220, for example. The above-described multilayer wiring substrate 1 is used as the image display screen 200.

The embodiment and exemplary application have been described above. However, the contents of the disclosure are not limited to the embodiment and exemplary application, and various modifications are possible. For example, materials for individual layers, thicknesses thereof, a method of forming films, a condition for forming films, a process for cutting and repairing a short-circuit defect, etc. are not limited to those in the foregoing embodiment. Other materials, thicknesses, methods of forming films, conditions for forming films, methods for cutting and repairing a short-circuit defect may be employed.

In this embodiment, the light emitting device 31 is used as an electronic device; however, for example, a light receiving element may be used.

It is to be noted that the effects described herein are mere exemplary and thus are not limiting. Further, other effects may be provided.

It is to be noted that the technology may have a configuration described below.

(1) A multilayer wiring substrate including:
   a substrate; and
   a first wire and a second wire that are provided on the substrate with an insulating layer having a light transmitting property in between, and one or both of which are subjected to a surface treatment.

(2) The multilayer wiring substrate according to (1), in which the first wire is provided on lower layer side of the insulating layer, the second wire is provided on upper layer side of the insulating layer, and the first wire is subjected to the surface treatment.

(3) The multilayer wiring substrate according to (1) or (2), in which the surface treatment is one of a blackening process, a blackening alternative roughing process, an etching process, and a plating process.

(4) The electronic device according to any one of (1) to (3), in which a wiring pitch of the first wire is larger than a wiring pitch of the second wire.

(5) The multilayer wiring substrate according to any one of (1) to (4), in which the first wire is coated with a metal material whose reflection factor is lower than a reflection factor of a material of the first wire, the metal material differing from the material of the first wire.

(6) The multilayer wiring substrate according to (5), in which the metal material has a lower capacity to liberate ions than the material of the first wire under an application of an electric potential.

(7) The multilayer wiring substrate according to any one of (1) to (6), in which the first wire and the second wire are made of materials same as each other.

(8) The multilayer wiring substrate according to any one of (1) to (7), in which each of the first wire and the second wire is made of one of copper (Cu) and nickel (Ni).

(9) The multilayer wiring substrate according to any one of (1) to (8), in which each of the first wire and the second wire is formed by plating.

(10) The multilayer wiring substrate according to any one of (5) to (9), in which the metal material is one of nickel (Ni), palladium (Pd), gold (Au), tin (Sn), tungsten (W), titanium (Ti), and an alloy thereof.

(11) A display unit including a plurality of light emitting devices provided on a multilayer wiring substrate, the multilayer wiring substrate including:

a substrate; and a first wire and a second wire that are provided on the substrate with an insulating layer having a light transmitting property in between, and one or both of which are subjected to a surface treatment.

(12) An electronic apparatus including a plurality of electronic devices provided on a multilayer wiring substrate, the multilayer wiring substrate including:

a substrate; and a first wire and a second wire that are provided on the substrate with an insulating layer having a light transmitting property in between, and one or both of which are subjected to a surface treatment.

(13) The electronic apparatus according to (12) in which each of the electronic devices is a light receiving device.

This application is based upon and claims the benefit of priority of the Japanese Patent Application No. 2014-247066 filed with the Japan Patent Office on Dec. 5, 2014, the entire contents of which are incorporated herein by reference.

It should be understood that those skilled in the art can contemplate various modifications, combinations, sub-combinations, and variations on the basis of design requirements and other factors insofar as they are within the scope of the appended claims or the equivalents thereof.

The invention claimed is:

1. A multilayer wiring substrate comprising:

a substrate; and a first wire and a second wire that are provided on the substrate such that the first wire creates optical inspection noise under the second wire in an optical inspection of the second wire, with an insulating layer having a light transmitting property in between, wherein the first wire is optically differentiated from the second wire with the first wire receiving a different surface treatment than the second wire, wherein the second wire receives no surface treatment and a pitch width of the first wire is different than the pitch width of the second wire, wherein the first wire is provided on lower layer side of the insulating layer, and the second wire is provided on upper layer side of the insulating layer, wherein the first wire is coated with a metal material whose reflection factor is lower than a reflection factor of a material of the first wire, the metal material differing from the material of the first wire, and wherein the metal material has a lower capacity to liberate ions than the material of the first wire under an application of an electric potential.

2. The multilayer wiring substrate according to claim 1, wherein the different surface treatment is one of a blackening process, a blackening alternative roughing process, an etching process, and a plating process.

3. The multilayer wiring substrate according to claim 1, wherein a width of the first wire is larger than a width of the second wire along an axis orthogonal to a direction of the optical inspection of the second wire.

4. The multilayer wiring substrate according to claim 1, wherein the metal material has a lower capacity to liberate ions than the material of the first wire under an application of an electric potential.

5. The multilayer wiring substrate according to claim 1, wherein the first wire and the second wire are made of materials same as each other.

6. The multilayer wiring substrate according to claim 1, wherein each of the first wire and the second wire is made of one of copper (Cu) and nickel (Ni).

7. The multilayer wiring substrate according to claim 1, wherein each of the first wire and the second wire is formed by plating.

8. The multilayer wiring substrate according to claim 1, wherein the metal material is one of nickel (Ni), palladium (Pd), gold (Au), tin (Sn), tungsten (W), titanium (Ti), and an alloy thereof.

9. A display unit comprising a plurality of light emitting devices provided on the multilayer wiring substrate of claim 1.

10. An electronic apparatus comprising a plurality of electronic devices provided on the multilayer wiring substrate of claim 1.

11. The electronic apparatus according to claim 10, wherein each of the electronic devices is a light receiving device.

12. The multilayer wiring substrate according to claim 1, wherein the first wire is under the second wire in the optical inspection of the second wire.

13. The multilayer wiring substrate according to claim 12, wherein the substrate is under the first wire in the optical inspection of the second wire.

14. The multilayer wiring substrate according to claim 12, further comprising:

an additional wire on the substrate under the first wire in the optical inspection of the second wire.

15. The multilayer wiring substrate according to claim 14, further comprising:

a bump between the additional wire and the first wire.

* * * * *